_(12)_ United States Patent
Bhuyan et al.

(10) Patent No.: US 12,131,900 B2
(45) Date of Patent: Oct. 29, 2024

(54) METHODS FOR DEPOSITING BLOCKING LAYERS ON METAL SURFACES

(71) Applicant: Applied Materials, Inc., Santa Clara, CA (US)

(72) Inventors: Bhaskar Jyoti Bhuyan, San Jose, CA (US); Mark Saly, Santa Clara, CA (US); Lakmal C. Kalutarage, San Jose, CA (US); Thomas Joseph Knisley, Livonia, MI (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/873,793

(22) Filed: Jul. 26, 2022

(65) Prior Publication Data

US 2022/0384176 A1 Dec. 1, 2022

Related U.S. Application Data

(62) Division of application No. 16/632,164, filed as application No. PCT/US2018/042467 on Jul. 17, 2018, now Pat. No. 11,417,515.

(Continued)

(51) Int. Cl.
*C23C 16/00* (2006.01)
*C23C 16/02* (2006.01)
(Continued)

(52) U.S. Cl.
CPC ...... *H01L 21/0217* (2013.01); *C23C 16/0245* (2013.01); *C23C 16/308* (2013.01); *C23C 16/45525* (2013.01); *H01L 21/02118* (2013.01); *H01L 21/02211* (2013.01); *H01L 21/0228* (2013.01); *H01L 21/02315* (2013.01); *H01L 21/31138* (2013.01)

(58) Field of Classification Search
CPC ................. C23C 16/00; H01L 21/00
See application file for complete search history.

(56) References Cited

U.S. PATENT DOCUMENTS

| 7,994,640 B1 | 8/2011 | Alers et al. |
| 2003/0049460 A1 | 3/2003 | O'Neill et al. |

(Continued)

FOREIGN PATENT DOCUMENTS

| CN | 101014730 A | 8/2007 |
| JP | 2010540773 A | 12/2010 |

(Continued)

OTHER PUBLICATIONS

"Functionalization of H-terminated Si(111) with 1,2-epoxy-9-decene", Emerging Researchers National (ERN) Conference, Feb. 2017. [Retrieved on Jul. 7, 2017.] Retrieved from the Internet: <URL: http://new.emerging-researchers.org/projects/13024/>, 2 pages.

(Continued)

*Primary Examiner* — Kelly M Gambetta
*Assistant Examiner* — Mohammad Mayy
(74) *Attorney, Agent, or Firm* — Servilla Whitney LLC

(57) ABSTRACT

Methods of enhancing selective deposition are described. In some embodiments, a blocking layer is deposited on a metal surface before deposition of a dielectric. In some embodiments, a metal surface is functionalized to enhance or decrease its reactivity.

16 Claims, 5 Drawing Sheets

Related U.S. Application Data

(60) Provisional application No. 62/533,890, filed on Jul. 18, 2017.

(51) Int. Cl.

| | | |
|---|---|---|
| *C23C 16/30* | (2006.01) | |
| *C23C 16/455* | (2006.01) | |
| *H01L 21/02* | (2006.01) | |
| *H01L 21/311* | (2006.01) | |

(56) References Cited

U.S. PATENT DOCUMENTS

| | | | |
|---|---|---|---|
| 2003/0104227 A1 | 6/2003 | Mccarthy et al. | |
| 2004/0213971 A1 | 10/2004 | Colburn et al. | |
| 2007/0292603 A1* | 12/2007 | Dordi | H01L 21/76879 427/98.1 |
| 2007/0292604 A1 | 12/2007 | Dordi et al. | |
| 2008/0213997 A1 | 9/2008 | Lee et al. | |
| 2011/0117328 A1* | 5/2011 | Ivanov | H01L 21/76858 428/172 |
| 2012/0312191 A1* | 12/2012 | Hood | C09D 133/14 548/255 |
| 2014/0206192 A1* | 7/2014 | Yeom | H01L 21/042 438/720 |
| 2015/0099375 A1* | 4/2015 | Haripin | H01L 21/0217 438/793 |
| 2016/0270237 A1* | 9/2016 | Cho | H01L 21/76834 |
| 2017/0069527 A1 | 3/2017 | Haukka et al. | |
| 2018/0198006 A1 | 7/2018 | Greer et al. | |

FOREIGN PATENT DOCUMENTS

| | | |
|---|---|---|
| KR | 20070095919 A | 10/2007 |
| KR | 20100123741 A | 11/2010 |
| KR | 20160002391 A | 1/2016 |
| KR | 20160132804 A | 11/2016 |
| KR | 20170016310 A | 2/2017 |
| TW | 200525642 A | 8/2005 |
| TW | 200711038 A | 3/2007 |
| WO | 2016178978 A1 | 11/2016 |
| WO | 2017/048911 A1 | 3/2017 |

OTHER PUBLICATIONS

PCT International Search Report and Written Opinion in PCT/US2018/042467 dated Oct. 31, 2018, 10 pages.

Arkles, Barry, et al., "Hydridosilane Modification of Metals: An Exploratory Study", Journal of Adhesion Science and Technology 26 (2012), pp. 41-54.

Ciampi, Simone, et al., "Functionalization of Acetylene-Terminated Monolayers on Si(100) Surfaces: A Click Chemistry Approach", Langmuir, vol. 23, No. 18, (2007), pp. 9320-9329.

Coats, Steven J., et al., "Trimethylsilyl-Directed 1,3-Dipolar Cycloaddition Reactions in the Solid-Phase Synthesis of 1,2,3-Triazoles", Organic Letters, vol. 7, No. 8, (2005), pp. 1469-1472.

Jeanquartier, Claire, et al., "A Two-Step Method to Covalently Bind Biomolecules to Group-IV Semiconductors: Si(111)/1,2-Epoxy-9-decene/Esterase", Langmuir, vol. 24, No. 24, 2008, pp. 13957-13961.

Kloss, Florian, et al., "Metal-Free 1,5-Regioselective Azide-Alkyne [3+2]-Cycloaddition", Chem. Asian J. (2011), 6, pp. 2816-2824.

Okamoto, Noriko, et al., "Cleavage of Carbon-Carbon Triple Bond: Direct Transformation of Alkynes to Nitriles", Organic Letters, vol. 15, No. 11, (Year: 2013), pp. 2571-2573.

Wang, Teng, et al., "Direct Approaches to Nitriles via Highly Efficient Nitrogenation Strategy through C—H or C—C Bond Cleavage", Acc. Chem. Res. (2014), 47, pp. 1137-1145.

Ziarani, Ghodsi Mohammadi, et al., "Advances in click chemistry for silica-based material construction", RSC Advances, 2016, 6, pp. 21979-22006.

\* cited by examiner

METHODS FOR DEPOSITING BLOCKING LAYERS ON METAL SURFACES

CROSS-REFERENCE TO RELATED APPLICATIONS

This application is a Divisional Application of U.S. application Ser. No. 16/632,164, filed on Jan. 17, 2020, which is the National Stage entry of PCT/US2018/042467, filed on Jul. 17, 2018, which claims priority to U.S. Provisional Application Ser. No. 62/533,890, filed Jul. 18, 2017, the entire disclosures of which are hereby incorporated by reference herein in their entireties.

FIELD

Embodiments of the disclosure relate methods for depositing blocking layers on metal surfaces. More particularly, embodiments of the disclosure are directed to methods of depositing blocking layers on metal surfaces to facilitate the deposition of silicon nitride on only dielectric surfaces.

BACKGROUND

The semiconductor industry faces many challenges in the pursuit of device miniaturization which involves rapid scaling of nanoscale features. Such issues include the introduction of complex fabrication steps such as multiple lithography steps and integration of high performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

There is an ongoing need in the art for methods to improve deposition selectivity.

SUMMARY

One or more embodiments of this disclosure relate to a method of selectively depositing a blocking layer. The method comprises exposing a substrate having a metal surface and a dielectric surface to a silane to form a blocking layer selectively on the metal surface, the silane comprising at least one compound with a general formula $SiH_3R$, where R is selected from C4-C20 alkyl, perfluoroalkyl, alkenyl or alkynyl groups.

Additional embodiments of this disclosure relate to methods of selectively depositing a blocking layer. The method comprises exposing a substrate having a metal surface and a dielectric surface to an alkyne and a nitrogen reactant to form a blocking layer selectively on the metal surface, the nitrogen reactant comprising an azide or a nitrile oxide.

Further embodiments of this disclosure relate to a method of selectively depositing a blocking layer. The method comprises exposing a substrate having a metal surface and a dielectric surface to an epoxide to selectively form a blocking layer on the metal surface.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
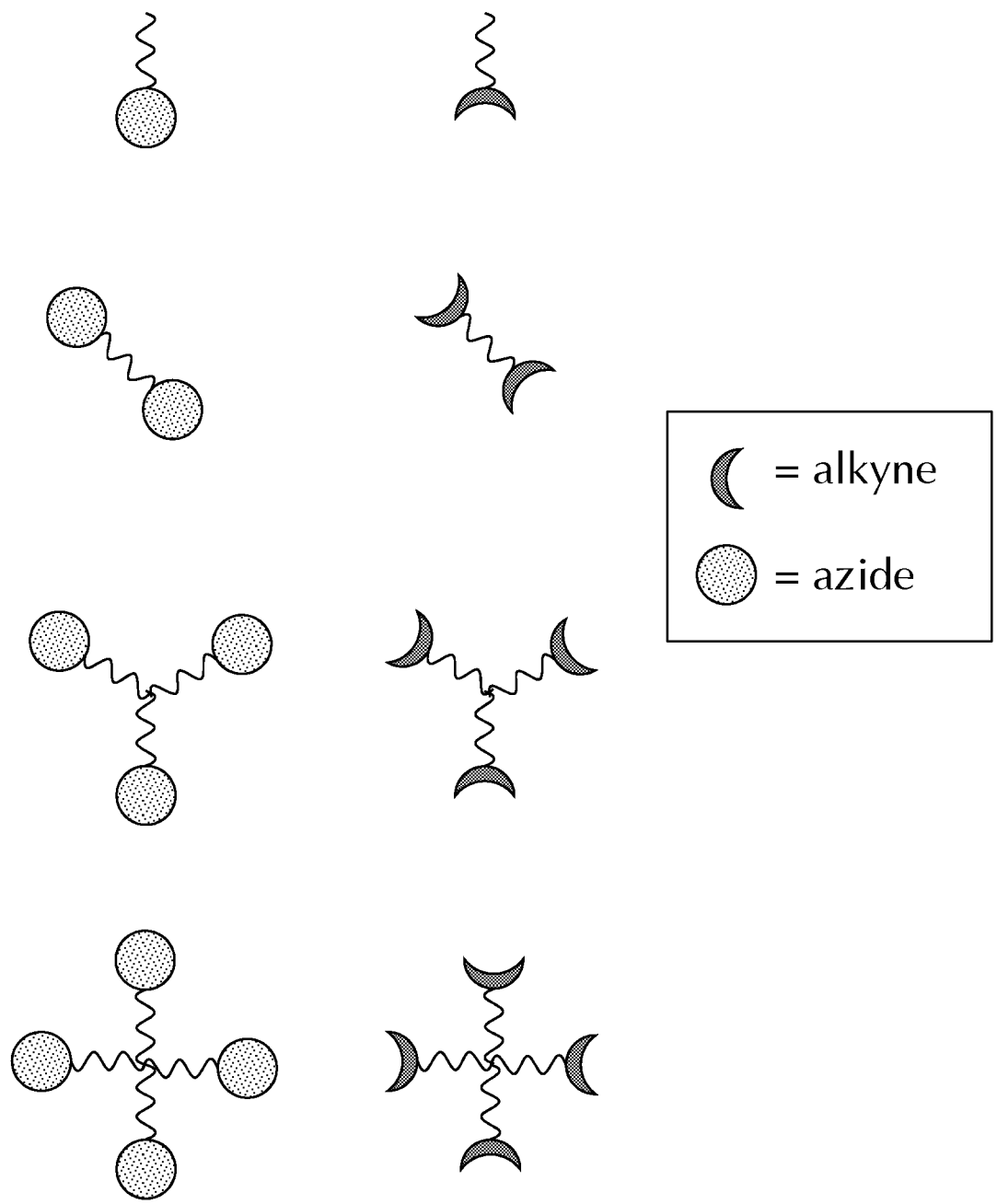
FIG. 1 shows a series of general structures with respect to the possible number or reactive groups for azide and alkyne blocking agents in accordance with one or more embodiment of the disclosure.

Embodiments of the disclosure provide methods for depositing blocking layers on metal surfaces. Embodiments of the disclosure identify methods for depositing blocking layers which may be used separately or in conjunction.

Embodiments of the disclosure provide methods for advantageously depositing dielectric materials (e.g. SiN) on dielectric surfaces by blocking deposition of dielectric materials on metal surfaces through blocking layers deposited on the metal surfaces.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

Embodiments of the disclosure advantageously provide methods for surface pretreatment, such as selective blocking of metal surfaces (including but are not limited to copper, cobalt, tungsten, tantalum, tantalum nitride, tantalum oxide, titanium, titanium oxide, titanium nitride, ruthenium, ruthenium oxide and iridium etc.). Some embodiments advantageously provide methods to selectively grow a dielectric material on a dielectric surface such as $SiO_2$, SiN, SiCON, SiCO, etc. Some embodiments advantageously provide methods to selectively block surface deposition using epoxide surface reactions.

In some embodiments, a metal silicide is selectively formed on a metal surface over a dielectric surface. As used in this specification and the appended claims, the phrase "selectively over", or similar, means that the subject material is deposited on the stated surface to a greater extent than on another surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface. In some embodiments, a long alkyl chain containing trihydridosilane ($RSiH_3$ where R=C4-C20) is used as a blocking molecule and is reacted with a metal surface (including but not limited to Cu, Co, W, and TiN) in solution or vapor phase. In some embodiments, the metal surface is cleaned prior to reaction with the blocking molecule. Organosilanes react with the metal surface selectively over a dielectric surface (e.g., $SiO_2$) through the silane head group. The organic portion of the silane acts as a hydrophobic protecting layer which blocks the growth of next dielectric layer (e.g., SiN) on metals enabling selective deposition of a dielectric on the dielectric surface.

One or more embodiments of this disclosure are directed to methods of selectively depositing a blocking layer on a metal surface of a substrate having a metal surface and a dielectric surface. The method comprises exposing the substrate to a silane comprising at least one compound with a general formula $SiH_3R$, where R is selected from C4-C20 alkyl, perfluoroalkyl, alkenyl or alkynyl groups. As used in this manner, the letter "C" followed by a numeral (e.g., "C4") means that the substituent comprises the specified number of carbon atoms (e.g., C4 comprises four carbon atoms). In some embodiments, the substituent can be straight chain groups (e.g. n-butyl), branched groups (e.g. t-butyl) or cyclic groups (e.g. cyclohexyl).

The dielectric surface of the substrate may comprise any suitable dielectric materials. Suitable dielectric materials include, but are not limited to, oxides (e.g., silicon oxides) and high-k dielectrics. In some embodiments, the dielectric surface consists essentially of silicon oxide. As used in this manner, the term "consists essentially of" means that the surface is greater than or equal to about 95%, 98% or 99% of the stated material, on an area basis.

The metal surface of the substrate may comprise any suitable metal materials. Suitable metal materials include, but are not limited to, metals, metal nitrides, metal alloys, and other conductive materials. In some embodiments, the metal surface comprises one or more of cobalt, tungsten or titanium nitride. In some embodiments, the metal surface consists essentially of cobalt. In some embodiments, the metal surface consists essentially of tungsten. In some embodiments, the metal surface consists essentially of titanium nitride.

The silane exposed to the substrate may comprise any suitable trihydridosilanes. In some embodiments, the silane comprises at least one compound with a general formula $SiH_3R$, where R is selected from C4-C20 alkyl, perfluoroalkyl, alkenyl or alkynyl groups. In some embodiments, C4-C20 alkyl groups consist essentially of one Si—C bond, C—C single bonds and C—H bonds. In some embodiments, C4-C20 perfluoroalkyl groups consist essentially of one Si—C bond, C—C single bonds and C—F bonds. In some embodiments, C4-C20 alkenyl groups consist essentially of one Si—C bond, C—C single bonds, at least one C—C double bond and C—H bonds. In some embodiments, C4-C20 alkynyl groups consist essentially of one Si—C bond, C—C single bonds, at least one C—C triple bond and C—H bonds. In some embodiments, the C4-C20 group includes one or more halogen atom and/or hydrophobic moiety.

In some embodiments, the silane comprises C4-C20 alkyl groups. In some embodiments, the silane comprises dodecylsilane ($C_{12}H_{25}SiH_3$). In some embodiments, the silane consists essentially of dodecylsilane.

In some embodiments, the silane groups cross-link with each other after deposition. In some embodiments, the blocking layer contains substantially no crosslinking between the silane groups. As used in this manner, the term "substantially no crosslinking" means that there is less than or equal to about 5%, 2% or 1% crosslinking on a surface area basis.

In some embodiments, the substrate is cleaned prior to exposing the substrate to the silane. In some embodiments, only the metal surface of the substrate is cleaned prior to exposing the substrate to the silane. In some embodiments, the substrate or the metal surface of the substrate is cleaned with a hydrogen plasma. In some embodiments, the hydrogen plasma is a conductively coupled plasma (CCP). In some embodiments, the hydrogen plasma is an inductively coupled plasma (ICP). In some embodiments, the hydrogen plasma comprises plasma of $H_2$.

In some embodiments, a dielectric layer is selectively deposited on the dielectric surface after deposition of the blocking layer. In some embodiments, the dielectric layer comprises silicon nitride. Deposition of silicon nitride can be performed through any suitable process. Suitable processes may include exposure of the substrate to a silicon halide and ammonia. Suitable silicon halides include, but are not limited to dichlorosilane (DCS), trichlorosilane (TCS), tetrachlorosilane ($SiCl_4$), tetrabromosilane ($SiBr_4$), tetraiodosilane ($SiI_4$), and hexachlorodisilane (HCDS).

In some embodiments, exposing the substrate to the silane is repeated after deposition of the dielectric layer to regenerate the blocking layer. In some embodiments, the dielectric layer is deposited again after the blocking layer is regenerated. In some embodiments, exposure of the substrate to a silane and depositing a silicon nitride layer is repeated until the silicon nitride layer has reached a predetermined thickness.

The exposure to the surface blocking chemistry, or blocking layer regeneration, can be performed once or repeated after a number of deposition cycles or after a film thickness is formed. In some embodiments, the silicon nitride layer is deposited with a thickness in the range of about 10 Å to about 50 Å, or in the range of about 12 Å to about 35 Å, or in the range of about 15 Å to about 20 Å before the blocking layer is regenerated. In some embodiments, exposure of the substrate to the silane and deposition of silicon nitride are repeated until the silicon nitride layer has a thickness of greater than or equal to 50 Å, 75 Å, 100 Å or 150 Å.

Example

Metal surfaces were cleaned using 2-10 min, 100 W, hydrogen plasma to reduce the native oxide concentration. Silane was deposited at a substrate temperature of 200° C. Metal silicide formation was initially studied with water contact angle (WCA) measurement. Higher contact angles indicated a hydrophobic surface (i.e., silicide formation). WCA indicated that $SiO_2$ was not blocked by dodecylsilane (DDS, R=C12) and metal surfaces (i.e. Co, W and TiN) were blocked. Hydrogen plasma treatment for surface cleaning facilitated formation of metal silicides.

Thermal and chemical stability test results indicated that DDS blocking on metals were stable to 200° C. for W and TiN and were stable up to 330° C. on Co. DDS self-assembled monolayers (SAM) can withstand silicon halide (dichlorosilane (DCS), trichlorosilane (TCS), tetrachlorosilane ($SiCl_4$), tetrabromosilane ($SiBr_4$), tetraiodosilane ($SiI_4$)) and $NH_3$, which are used for SiN ALD.

WCA studies with different thicknesses of SiN deposited on DDS SAM showed that when SAM is regenerated after 15-20 Å of SiN growth, selectivity can be attained up to a minimum thickness of ~50 Å on Co, W and TiN surfaces. Selectivity can be extended by repeating the number of regeneration cycles in between the SiN formation. It was observed that DDS treated substrates have almost no SiN (which oxidizes to $SiO_2$ due to air exposure) growth, whereas DDS untreated substrates have ~40-50 Å SiN growth.

In some embodiments, a substituted azide or nitrile oxide and a alkyne are reacted in the presence of a copper surface to form a blocking layer. This reaction forms a surface-bound species that can have the potential to render the newly-functionalized copper surface inert or promote reactivity towards incoming film deposition precursors. For example, azides or nitrile oxides react with alkynes in the presence of copper metal to form triazoles or isooxazoles (in the case of azides or nitrile oxides, respectively). In some embodiments, trimethylsilyl azide and trimethylsilyl acetylene are reacted in the presence of a copper metal surface to form the resultant surface-bound triazole. In some embodiments, the substituted azide and alkyne precursors are introduced to the substrate sequentially in the vapor phase.

In some embodiments, either a substituted azide or a nitrile oxide and a substituted alkyne are reacted in the presence of a metal surface. The number of reactive substituents on each molecule (azide, nitrile oxide and alkyne), N, can be in the range of 1-4 reactive groups. In some embodiments, the number of reactive groups is greater than 1.

With reference to FIG. 1, a series of general structures are shown with respect to the possible number or reactive groups for azides and alkynes. The wavy line that holds the groups together can be any molecular chain that holds the reactive groups together (C-based, Si-based, or even other elements like B, P, N, O and S).

Figure 2:
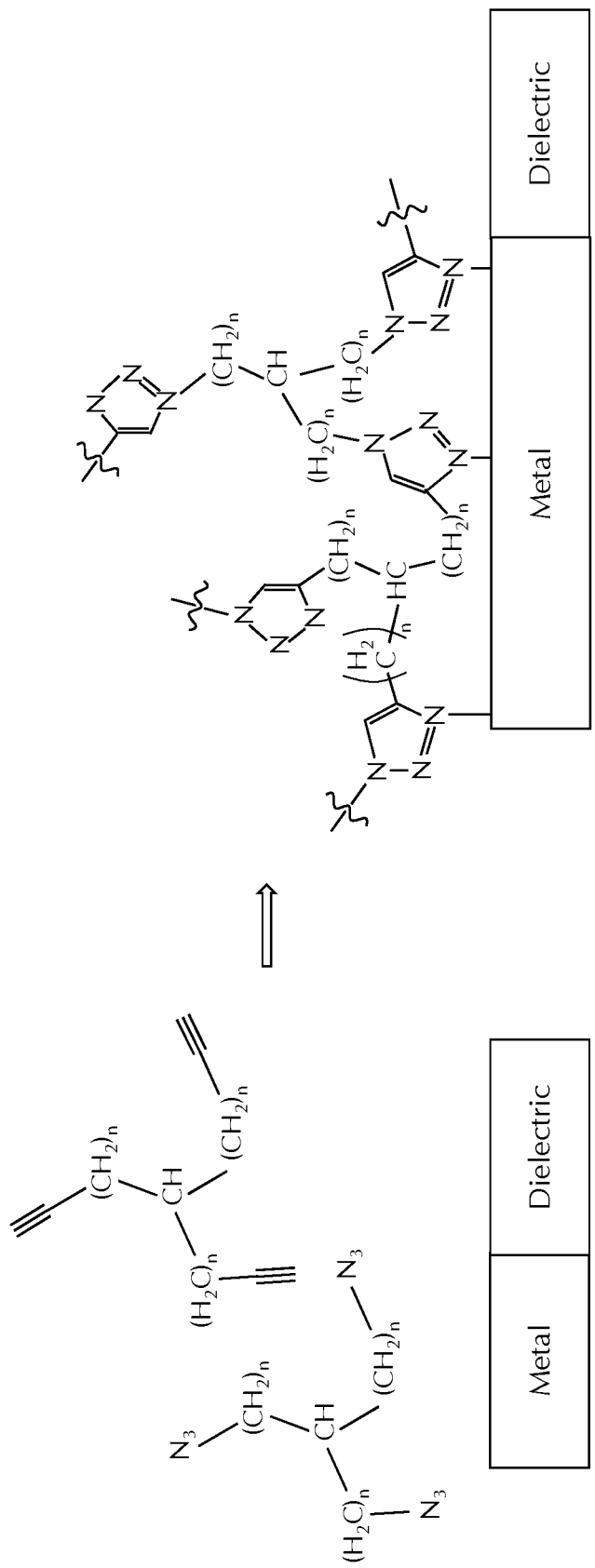
FIG. 2 shows a reaction schematic of the monomers in the presence of a metal surface and the cyclization reaction to produce a polymeric network selectively on the metal surface in accordance with one or more embodiment of the disclosure.

Without being bound by theory, when these monomers are in the presence of a metal surface, it is believed that the moieties undergo a cyclization reaction to form polymeric networks on the metal surface, but not the dielectric surface, as illustrated in FIG. 2. It is believed that the bonding of the polymeric network to the metal surface occurs through the nitrogen substituents on the polymer and the interaction with the pi electrons of the heterocyclic ring with the metal surface.

Figure 3:
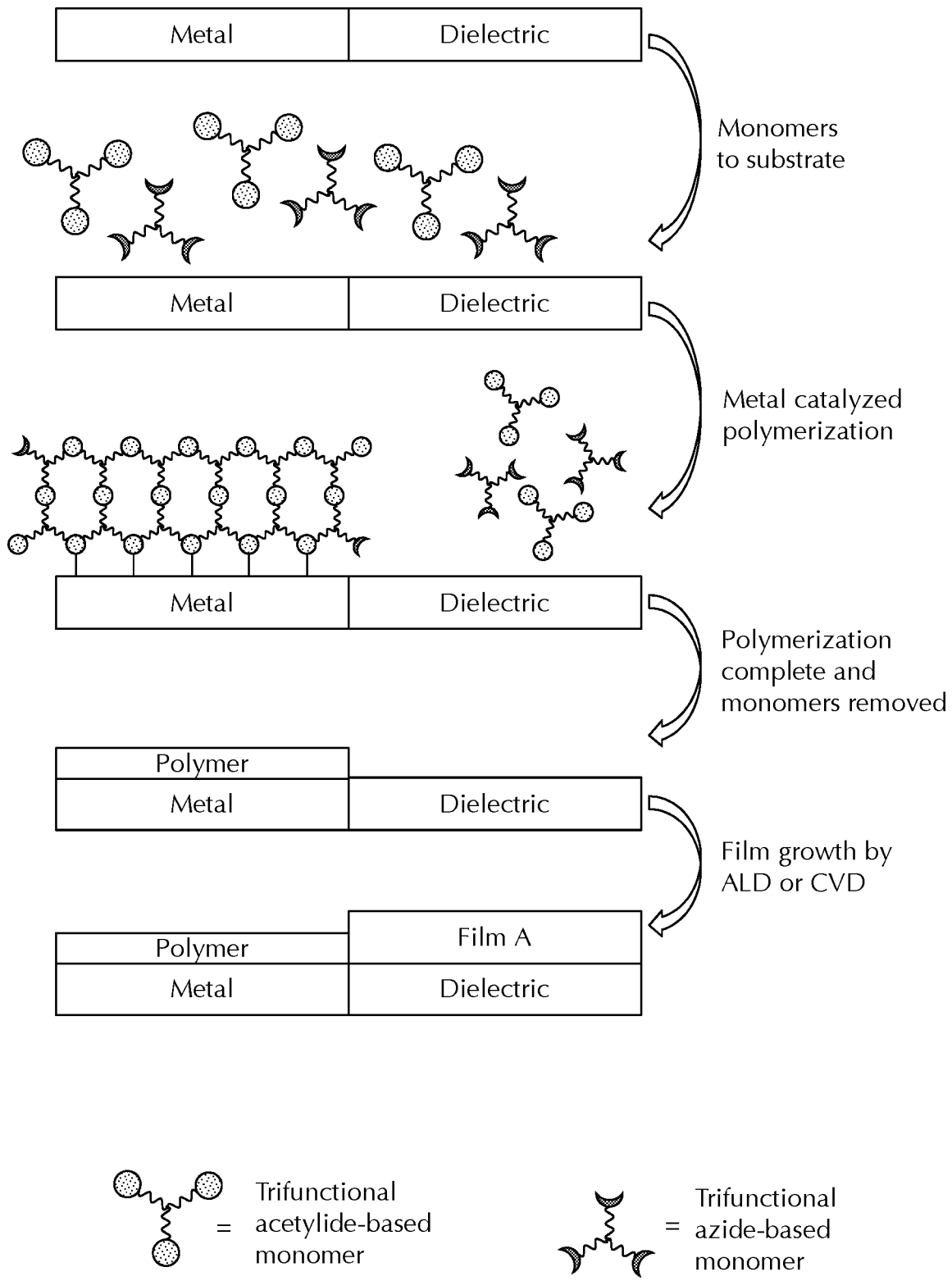
FIG. 3 shows a generic process flow to enable selective deposition of a polymer blocking layer on a metal surface and a dielectric film on a dielectric surface in accordance with one or more embodiment of the disclosure.

FIG. 3 shows a generic process flow according to some embodiments of the disclosure to enable selective deposition. The flow starts with introducing acetylide-based (e.g. alkynes) and azide-based monomers to the substrate via solution phase, neat, or vapor phase methods at temperatures in the range of about 20° C. to about 600° C. In some embodiments, the metal surface is a pristine metal surface without any oxide on the surface. After monomer introduction, the polymer network starts to form on the metal surface via metal-catalyzed triazole formation. After the metal catalyzed polymerization is completed the unreacted monomers may be removed by washing the surfaces with a solvent (if done in solution phase) or using an inert gas purge inside of a reactor. A film that only nucleates on the dielectric can then be deposited.

Figure 4:
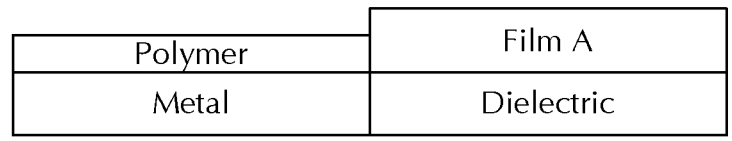
FIG. 4 shows an example of a process to remove a polymer blocking layer through the use of an oxygen-based remote plasma and hydrogen-based remote plasma in accordance with one or more embodiment of the disclosure.
Figure 4:
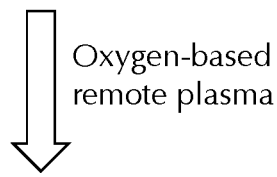
Figure 4:
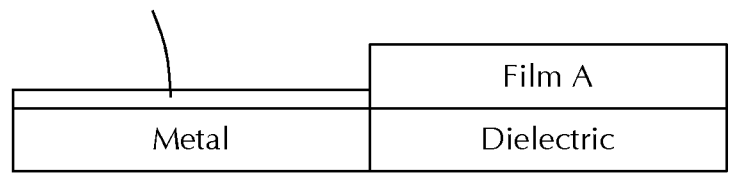
Figure 4:
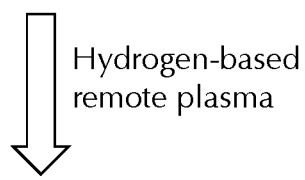
Figure 4:

After the process flow is completed, the polymer layer can be removed using selective etching processes. Oxygen-based and fluorine-based etches are known to etch carbon based films similar to the blocking layer deposited here. FIG. 4 shows an example of removing the polymer via an oxygen-based remote plasma. In this example the polymer is being removed via an oxygen-based remote plasma etch which removes the polymer but also oxidizes the metal surface. To recover the original metal surface, the metal oxide can be reduced back to the metal. In some embodiments, reduction includes exposure to $H_2$ and $NH_3$ plasma, and/or $H_2$ and $NH_3$ thermal anneals.

Figure 5:
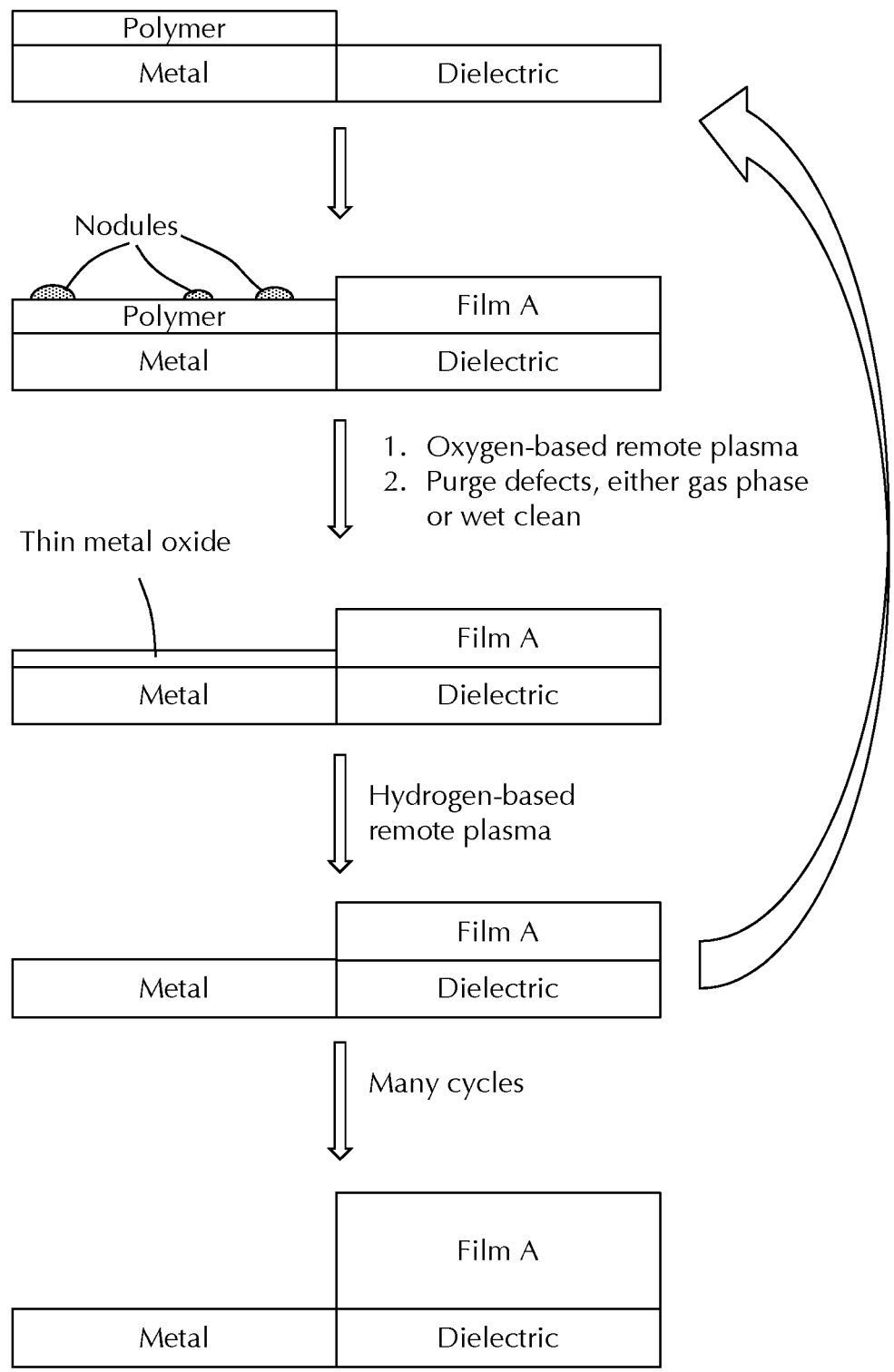
FIG. 5 shows a process flow for a selective deposition process in accordance with one or more embodiment of the disclosure.

In some embodiments, some deposition of the film can occur on the blocking layer which may lead to defects (labelled as nodules in FIG. 5). In one or more embodiments, the polymer is removed along with the defects and the polymerization reaction is started over again to continue selective growth.

One or more embodiments of the disclosure are directed to methods of selectively depositing a blocking layer on the metal surface of a substrate having a metal surface and a dielectric surface. The method comprises exposing the substrate to an alkyne and a nitrogen reactant to form a blocking layer selectively on the metal surface, the nitrogen reactant comprising an azide or a nitrile oxide.

In some embodiments, the metal surface comprises copper. In some embodiments, the metal surface consists essentially of copper.

In some embodiments, the alkyne and the nitrogen reactant are exposed to the substrate simultaneously. In some embodiments, the exposure is performed through the solution phase exposure of the substrate to a solution comprising both of the alkyne and the nitrogen reactant. In some embodiments, the exposure is performed through the vapor phase exposure of the substrate to a gas comprising both of the alkyne and the nitrogen reactant.

In some embodiments, the alkyne and the nitrogen reactant are exposed to the substrate sequentially. In some embodiments, the alkyne is exposed to the substrate first. In some embodiments, the nitrogen reactant is exposed to the substrate first. In some embodiments, the exposure is performed through the solution phase exposure of the substrate to a solution comprising either the alkyne or the nitrogen reactant. In some embodiments, the exposure is performed through the vapor phase exposure of the substrate to a gas comprising either the alkyne or the nitrogen reactant. In some embodiments, one exposure is in the solution phase and the other in the vapor phase. In some embodiments, the substrate is purged (vapor phase) or washed (solution phase) of the previous reactant before exposure to the other reactant.

In some embodiments, the alkyne comprises two or more alkyne moieties. In some embodiments, the alkyne comprises two or three or four or more alkyne moieties. In some embodiments, the alkyne comprises at least one compound with a general formula SiR4, where each R is independently selected from C1-C18 alkyl, aryl, or alkynyl groups provided that at least one R is alkynyl.

In some embodiments, the alkyne comprises one or more of the following compounds:

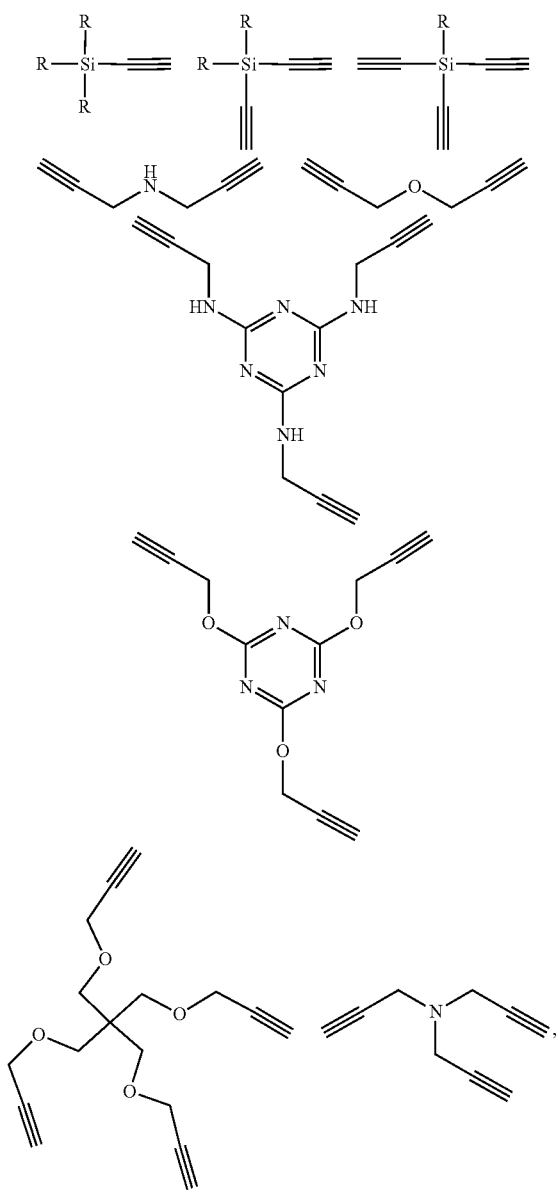

where each R is independently selected from C1-C18 alkyl or aryl groups.

In some embodiments, the nitrogen reactant comprises an azide. In some embodiments, the nitrogen reactant consists essentially of azide. As used in this manner, the term "consists essentially of azide" means that the reactive component of the nitrogen reactant (e.g., not including inert components) is greater than or equal to about 95%, 98% or 99% azides, on a molecular basis. In some embodiments, the nitrogen reactant comprises a nitrile oxide. In some embodiments, the nitrogen reactant consists essentially of nitrile oxides. As used in this manner, the term "consists essentially of nitrile oxides" means that the reactive component of the nitrogen reactant (e.g., not including inert components) is greater than or equal to about 95%, 98% or 99% nitrile oxides, on a molecular basis. In some embodiments, the nitrogen reactant comprises substantially no nitrile oxides. As used in this manner, the term "substantially no nitrile oxide" means that the nitrogen reactant has less than or equal to about 5%, 2% or 1% nitrile oxides on a molecular basis.

In some embodiments, the azide comprises two or more azide moieties. In some embodiments, the azide comprises two or three or four or more azide moieties. In some embodiments, the azide comprises at least one compound with a general formula SiR4, where each R is independently selected from C1-C18 alkyl, aryl, or azide groups provided that at least one R is azide.

In some embodiments, the azide comprises one or more of the following compounds:

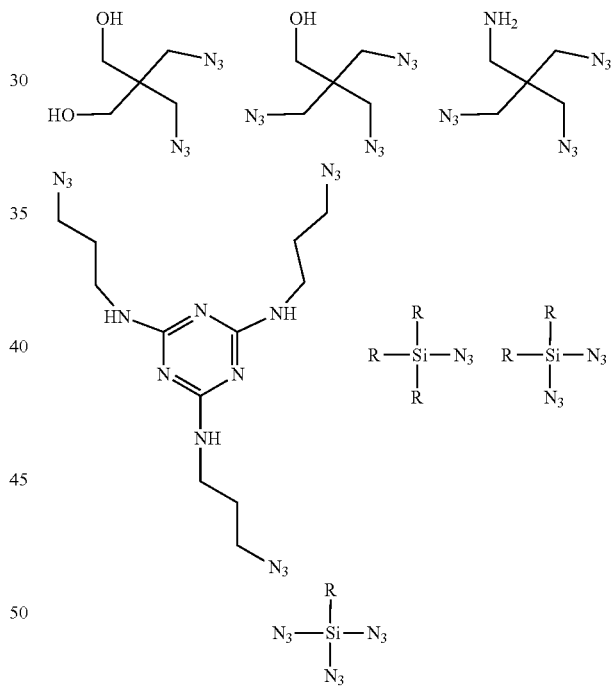

where each R is independently selected from C1-C18 alkyl or aryl groups.

In some embodiments, the substrate is cleaned prior to exposing the substrate to the alkyne or the nitrogen reactant. In some embodiments, only the metal surface of the substrate is cleaned prior to exposing the substrate to the alkyne or the nitrogen reactant. In some embodiments, the substrate or the metal surface of the substrate is cleaned with a hydrogen plasma. In some embodiments, the hydrogen plasma is a conductively coupled plasma (CCP). In some embodiments, the hydrogen plasma is an inductively coupled plasma (ICP). In some embodiments, the hydrogen plasma comprises plasma of $H_2$.

In some embodiments, a dielectric layer is selectively deposited on the dielectric surface after deposition of the blocking layer. In some embodiments, the dielectric layer comprises silicon nitride. Deposition of silicon nitride can be performed through any suitable process. Suitable processes may include exposure of the substrate to a silicon halide and ammonia. Suitable silicon halides include, but are not limited to dichlorosilane (DCS), trichlorosilane (TCS), tetrachlorosilane ($SiCl_4$), tetrabromosilane ($SiBr_4$), tetraiodosilane ($SiI_4$), and hexachlorodisilane (HCDS).

In some embodiments, the blocking layer is removed from the substrate. The blocking layer may be removed by any suitable selective etching process. Suitable selective etching processes include, but are not limited to, the use of oxygen plasmas and fluorine plasmas. In some embodiments, when oxygen plasma is used to remove the blocking layer, a metal oxide layer is formed on the metal surface. In some embodiments, the metal oxide layer formed on the metal surface is removed through the use of a reduction process. Suitable reduction processes include, but are not limited to, the use of plasmas comprising hydrogen or ammonia and thermal anneals comprising hydrogen or ammonia. In some embodiments, the oxygen plasma, fluorine plasma, hydrogen plasma and ammonia plasma can be independently remotely or internally generated, and conductively coupled or inductively coupled.

In some embodiments, after the silicon nitride layer is deposited, the blocking layer is removed by sequential exposure of the substrate to an oxygen plasma and a hydrogen plasma and the substrate exposed to the alkyne and nitrogen reactant to selectively block the metal surface and a silicon nitride film selectively deposited on the dielectric surface. The removal of the blocking layer, exposure of the substrate and deposition of the silicon nitride film may be repeated until a silicon nitride film of a predetermined thickness is formed.

In some embodiments, a cobalt surface may have enhanced surface reactivity or rendered inert. In some embodiments, cobalt can engage in catalysis in the presence of epoxides to form a newly functionalized surface. The newly-formed surface may be used for further processing.

One or more embodiments of this disclosure are directed to methods of selectively depositing a blocking layer on the metal surface of a substrate having a metal surface and a dielectric surface. The method comprises exposing the substrate to an epoxide to form a blocking layer selectively on the metal surface. In some embodiments, the metal surface comprises cobalt. In some embodiments, the metal surface consists essentially of cobalt.

In some embodiments, the exposure is performed through the solution phase exposure of the substrate to a solution comprising the epoxide. In some embodiments, the exposure is performed through the vapor phase exposure of the substrate to a gas comprising the epoxide.

In some embodiments, the epoxide comprises two or more epoxide moieties. In some embodiments, the epoxide is substituted. In some embodiments, the epoxide comprises two or three or four or more epoxide moieties. In some embodiments, the epoxide comprises one or more of the following compounds:

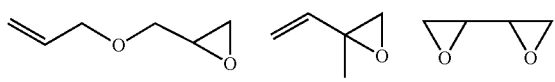

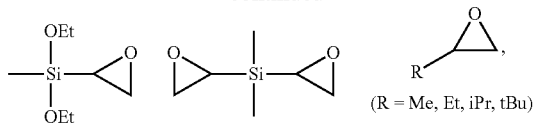

where R is independently selected from C1-C4 alkyl groups.

In some embodiments, the epoxide comprises two or more epoxide moieties which each react with the substrate surface. In some embodiments, the epoxide comprises two or more epoxide moieties of which only one reacts with the substrate surface.

In some embodiments, the substrate is cleaned prior to exposing the substrate to the epoxide. In some embodiments, only the metal surface of the substrate is cleaned prior to exposing the substrate to the epoxide. In some embodiments, the substrate or the metal surface of the substrate is cleaned with a hydrogen plasma. In some embodiments, the hydrogen plasma is a conductively coupled plasma (CCP). In some embodiments, the hydrogen plasma is an inductively coupled plasma (ICP). In some embodiments, the hydrogen plasma comprises plasma of $H_2$.

In some embodiments, a dielectric layer is selectively deposited on the dielectric surface after deposition of the blocking layer. In some embodiments, the dielectric layer comprises silicon nitride. Deposition of silicon nitride can be performed through any suitable process. Suitable processes may include exposure of the substrate to a silicon halide and ammonia. Suitable silicon halides include, but are not limited to dichlorosilane (DCS), trichlorosilane (TCS), tetrachlorosilane ($SiCl_4$), tetrabromosilane ($SiBr_4$), tetraiodosilane ($SiI_4$), and hexachlorodisilane (HCDS).

In some embodiments, the blocking layer is removed from the substrate. The blocking layer may be removed by any suitable selective etching process. Suitable selective etching processes include, but are not limited to, the use of oxygen plasmas and fluorine plasmas. In some embodiments, when oxygen plasma is used to remove the blocking layer, a metal oxide layer is formed on the metal surface. In some embodiments, the metal oxide layer formed on the metal surface is removed through the use of a reduction process. Suitable reduction processes include, but are not limited to, the use of plasmas comprising hydrogen or ammonia and thermal anneals comprising hydrogen or ammonia. In some embodiments, the oxygen plasma, fluorine plasma, hydrogen plasma and ammonia plasma can be independently remotely or internally generated, and conductively coupled or inductively coupled.

Silyl halide precursors generally do not chemisorb on $SiO_2$ surfaces because surface Si—OH groups do not react with Si—Cl under gas phase ALD conditions. For example, ALD $SiO_2$ films do not form from $SiCl_4/H_2O$ processes under normal ALD conditions. However, the inventors have found that adding a titanium precursor to the ALD scheme ($SiCl_4/H_2O/TiCl_4/H_2O$) can result in formation of $Ti_xSi_yO_z$ films.

Without being bound by theory, it is believed that although Si—OH does not react with Si—Cl, Ti—OH reacts with Si—Cl due to the lower electronegativity of Ti than Si and Ti—OH is more reactive towards Si—Cl than Si—OH. In some embodiments, this reactivity difference is used to block TiN but not $SiO_2$.

A TiN surface oxidizes upon exposure to air and the surface will have Ti—OH groups. When $RSiCl_3$ (SAM) is pulsed on air exposed TiN and SiO$_2$ surfaces, Si—Cl bonds will react with surface Ti—OH but not with Si—OH.

Some embodiments of the disclosure are directed to methods of blocking TiN, W, Cu, or Co by trichlorosilylhydrocarbon compounds, in gas phase and/or solution phase. In some embodiments, compounds with the general formula SiX$_3$R, where X is a halogen and R is C1-C18 alkyl, aryl and alkyl amines are used to block TiN, W, Cu or Co surfaces.

One or more embodiments of this disclosure are directed to methods of selectively depositing a blocking layer on the metal surface of a substrate having a metal surface and a dielectric surface. The method comprises exposing the substrate to a trihalosilylhydrocarbon to form a blocking layer selectively on the metal surface, the trihalosilylhydrocarbon comprises at least one compound with a general formula SiX$_3$R, where R is C1-C18 alkyl, aryl, or alkyl amino.

In some embodiments, the exposure to trihalosilylhydrocarbon is performed through the solution phase exposure of the substrate to a solution comprising the trihalosilylhydrocarbon. In some embodiments, the exposure to trihalosilylhydrocarbon is performed through the vapor phase exposure of the substrate to a gas comprising the trihalosilylhydrocarbon.

In some embodiments, the trihalosilylhydrocarbon comprises one or more of the following compounds:

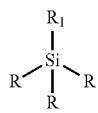

R=Cl, Br, I
R$_1$=tBu, Me, Et, iPr, hydrocarbons from C3 to C18, NMe2, NEt2, phenyl, benzyl In some embodiments, R$_1$ is any C1-C18 alkyl, aryl, alkyl amino or benzyl.

In some embodiments, the trihalosilylhydrocarbon comprises at least one compound with a general formula SiX$_3$R, where R is C1-C18 alkyl, aryl, or alkyl amino. As used in this regard, "alkyl amino" denotes an amino group with alkyl substituents. Stated another way, alkyl amino substituents have the general formula —NR$_2$ where each R is independently H, C1-C6 alkyl or aryl. For example, —N(CH$_3$)$_2$ and —N(CH$_2$CH$_3$)$_2$.

In some embodiments, the substrate is exposed to air prior to exposing the substrate to the trihalosilylhydrocarbon. In some embodiments, only the metal surface of the substrate is exposed to air prior to exposing the substrate to the trihalosilylhydrocarbon.

Example

Blocking of TiN Surface by ODTS (Octadecyltrichlorosilane)

ODTS was dissolved in toluene and the coupons were dipped in the solution at room temperature for a set period of time. After the dip, samples were washed with toluene and dried with nitrogen. SAM formation was monitored by measuring water contact angle (WCA). In 1 s dip, SAM formation saturates on TiN but not on SiO$_2$. With increasing dip time WCA on TiN stays constant but WCA on SiO$_2$ increases.

Low temperature ALD SiON was deposited on SAM treated substrates to evaluate the selective dielectric deposition. Substrates were kept at 200° C. and alternating pulses of hexachlorodisilane (HCDSO) and NH$_3$ were performed. Film thickness of SiON was measured by ellipsometry. About 5 times selectivity was observed after 150 cycles. Selectivity lowered with increasing number of cycles.

Blocking of TiN Surface by OTS (Octyltrisilane).

OTS was dissolved in toluene and the coupons were dipped in the solution at room temperature for a set period of time. After the dip, samples were washed with toluene and dried with nitrogen. SAM formation was monitored by measuring water contact angle (WCA). WCA change showed similar trend with ODTS experiment.

Thermal stability of deposited SAM on various substrates was evaluated by WCA measurements. OTS SAM was deposited in solution phase and gas phase. SAM deposited coupons were annealed for 1 hour at temperatures from 200° C. to 350° C. and WCA was measured before and after the annealing. It was found that SAM on TiN and W are stable up to 250° C. but degrade above that. In contrast, SAM on SiO$_2$ is stable to greater than 350° C. Gas phase SAM deposition gave more flexibility to achieve higher WCA change between TiN and SiO$_2$ than in solution phase.

Chemical stability of SAM was evaluated by annealing the SAM deposited coupons for one hour at 200° C. under the precursors used in SiON deposition (HCDSO and NH$_3$). Although SAM is stable at 200° C., under ALD precursors there was some degradation.

One or more embodiments of the method provide a blocking layer using an atomic layer deposition (ALD) process. In a time-domain ALD process, exposure to each reactive compound is separated by a time delay to allow each compound to adhere and/or react on the substrate surface and then be purged from the processing chamber. The reactive gases are prevented from mixing by the purging of the processing chamber between subsequent exposures.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the processing gases. During substrate movement, different portions of the substrate surface, or material on the substrate surface, are exposed to the two or more reactive compounds so that any given point on the substrate is substantially not exposed to more than one reactive compound simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In one aspect of a time-domain ALD process, a first reactive gas (i.e., a first precursor or compound A) is pulsed into the reaction zone followed by a first time delay. A second precursor or compound B is pulsed into the reaction zone followed by a second delay. During each time delay, a purge gas, such as argon, is introduced into the processing chamber to purge the reaction zone or otherwise remove any residual reactive compound or reaction products or by-products from the reaction zone. Alternatively, the purge gas may flow continuously throughout the deposition process so that only the purge gas flows during the time delay between pulses of reactive compounds. The reactive compounds are alternatively pulsed until a predetermined film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In one aspect of a spatial ALD process, a first reactive gas and second reactive gas are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to the first reactive gas and the second reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

While the embodiment of the processing method described above includes only two pulses of reactive gases, it will be understood that this is merely exemplary and that additional pulses of process gases may be used. The pulses can be repeated in their entirety or in part. The cycle can be repeated to form a blocking layer of a predetermined thickness. In some embodiments, the cycle is repeated to form a blocking layer with a thickness in the range of about 5 Å to about 40 Å, or in the range of about 10 Å to about 30 Å, or in the range of about 15 Å to about 20 Å.

Once the predetermined thickness has been reached, the method may optionally include further processing (e.g., bulk deposition of a dielectric film). In some embodiments, the further processing may be an ALD process. For example, in some embodiments, an ALD process may be performed to bulk deposit a silicon nitride layer to a target thickness.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a blocking layer, the method comprising:
    exposing a substrate having a metal surface and a dielectric surface to an epoxide to selectively form a blocking layer on the metal surface, wherein the epoxide is substituted;
    selectively depositing a silicon nitride layer on the dielectric surface;
    repeating exposure of the substrate to a silane to deposit the silicon nitride layer until the silicon nitride layer has reached a predetermined thickness; and
    removing the blocking layer from the substrate by sequential exposure of the substrate to an oxygen plasma and a hydrogen plasma.

2. The method of claim 1, wherein the metal surface comprises cobalt.

3. The method of claim 1, wherein the epoxide contains more than one epoxide moiety.

4. The method of claim 1, wherein the epoxide comprises one or more of the following compounds:

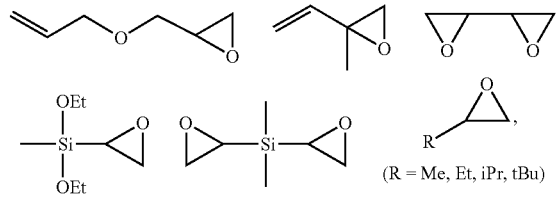

where R is independently selected from C1-C4 alkyl groups.

5. The method of claim 1, further comprising cleaning the metal surface with a hydrogen plasma before exposing the substrate to the epoxide.

6. The method of claim 5, wherein the hydrogen plasma comprises one or more of a conductively coupled plasma (CCP), an inductively coupled plasma (ICP), or plasma of $H_2$.

7. A method of selectively depositing a blocking layer, the method comprising exposing a substrate having a metal surface and a dielectric surface to an epoxide to selectively form a blocking layer on the metal surface, wherein the epoxide contains more than one epoxide moiety.

8. The method of claim 7, wherein the metal surface comprises cobalt.

9. The method of claim 7, wherein the epoxide comprises one or more of the following compounds:

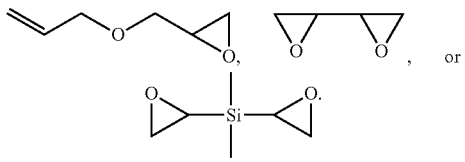

10. The method of claim 7, further comprising cleaning the metal surface with a hydrogen plasma before exposing the substrate to the epoxide.

11. The method of claim 7, further comprising selectively depositing a silicon nitride layer on the dielectric surface.

12. The method of claim 11, further comprising repeating exposure of the substrate to a silane to deposit a silicon nitride layer until the silicon nitride layer has reached a predetermined thickness, and removing the blocking layer from the substrate by sequential exposure of the substrate to an oxygen plasma and a hydrogen plasma.

13. A method of selectively depositing a blocking layer, the method comprising exposing a substrate having a metal surface comprising cobalt and a dielectric surface to an epoxide to selectively form a blocking layer on the metal surface, wherein the epoxide comprises one or more of the following compounds:

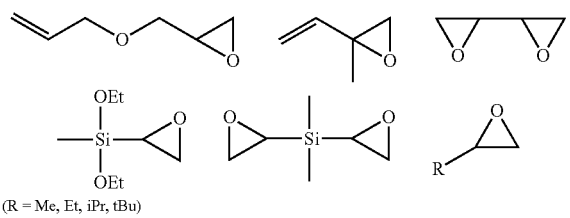

where R is independently selected from C1-C4 alkyl groups.

14. The method of claim 13, further comprising cleaning the metal surface with a hydrogen plasma before exposing the substrate to the epoxide.

15. The method of claim 14, wherein the hydrogen plasma comprises one or more of a conductively coupled plasma (CCP), an inductively coupled plasma (ICP), or plasma of $H_2$.

16. The method of claim 15, further comprising:

selectively depositing a silicon nitride layer on the dielectric surface;

repeating exposure of the substrate to a silane to deposit a silicon nitride layer until the silicon nitride layer has reached a predetermined thickness; and removing the blocking layer from the substrate by sequential exposure of the substrate to an oxygen plasma and a hydrogen plasma.

* * * * *

UNITED STATES PATENT AND TRADEMARK OFFICE
CERTIFICATE OF CORRECTION

PATENT NO. : 12,131,900 B2
APPLICATION NO. : 17/873793
DATED : October 29, 2024
INVENTOR(S) : Bhaskar Jyoti Bhuyan et al.

Page 1 of 1

It is certified that error appears in the above-identified patent and that said Letters Patent is hereby corrected as shown below:

In the Specification

Column 11, Line 62, replace "1 s" before "dip, SAM" and after "angle (WCA). In" with "1s".

Signed and Sealed this
Twenty-eighth Day of January, 2025

Coke Morgan Stewart
*Acting Director of the United States Patent and Trademark Office*